United States Patent
Frischeisen et al.

(10) Patent No.: US 10,847,684 B2
(45) Date of Patent: Nov. 24, 2020

(54) OPTOELECTRONIC COMPONENT AND METHOD OF MANUFACTURING AN OPTOELECTRONIC COMPONENT

(71) Applicant: OSRAM Opto Semiconductors GmbH, Regensburg (DE)

(72) Inventors: Jörg Frischeisen, Schwabmünchen (DE); Angela Eberhardt, Augsburg (DE); Florian Peskoller, Ingolstadt (DE); Thomas Huckenbeck, Augsburg (DE); Michael Schmidberger, Schwabmünchen (DE); Jürgen Bauer, Wielenbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/463,509

(22) PCT Filed: Feb. 21, 2018

(86) PCT No.: PCT/EP2018/054283
§ 371 (c)(1),
(2) Date: May 23, 2019

(87) PCT Pub. No.: WO2018/158124
PCT Pub. Date: Sep. 7, 2018

(65) Prior Publication Data
US 2019/0378958 A1    Dec. 12, 2019

(30) Foreign Application Priority Data
Feb. 28, 2017   (DE) ........................ 10 2017 104 133

(51) Int. Cl.
*H01L 33/50*   (2010.01)
*C03C 14/00*   (2006.01)

(52) U.S. Cl.
CPC ............ *H01L 33/501* (2013.01); *C03C 14/00* (2013.01); *H01L 33/505* (2013.01); *C03C 2217/944* (2013.01)

(58) Field of Classification Search
CPC ..... H01L 33/501; H01L 33/505; C03C 14/00; C03C 2217/944
See application file for complete search history.

(56) References Cited

U.S. PATENT DOCUMENTS

| 9,380,652 B2 * | 6/2016 | Bergenek | H05B 33/02 |
| 2012/0171420 A1 * | 7/2012 | Molins | H01B 3/087 |
| | | | 428/141 |

(Continued)

FOREIGN PATENT DOCUMENTS

| DE | 10 2012 110 668 A1 | 5/2014 |
| DE | 10 2012 220 980 A1 | 5/2014 |

(Continued)

*Primary Examiner* — Victor A Mandala
(74) *Attorney, Agent, or Firm* — DLA Piper LLP (US)

(57) ABSTRACT

An optoelectronic component includes a semiconductor layer sequence having an active region that emits radiation during operation at least via a main radiation exit surface, and a self-supporting conversion element arranged in a beam path of the semiconductor layer sequence, wherein the self-supporting conversion element includes a substrate and a first layer, the first layer includes at least one conversion material embedded in a glass matrix, the glass matrix has a proportion of 50 to 80 vol. % in the first layer, the substrate is free of the glass matrix and the conversion material and mechanically stabilizes the first layer, and the first layer has a layer thickness of less than 200 μm.

16 Claims, 3 Drawing Sheets

(56) References Cited

U.S. PATENT DOCUMENTS

| | | |
|---|---|---|
| 2013/0256598 A1 | 10/2013 | Aitken et al. |
| 2013/0320385 A1 | 12/2013 | Ahlstedt et al. |
| 2015/0211712 A1* | 7/2015 | Yoshimura .............. H01S 5/005 |
| | | 362/84 |
| 2015/0255688 A1 | 9/2015 | Stoll et al. |
| 2015/0353417 A1* | 12/2015 | Mori .................... G02B 5/0294 |
| | | 359/599 |
| 2017/0166807 A1* | 6/2017 | Kuzumoto ........... C09K 11/025 |

FOREIGN PATENT DOCUMENTS

| | | |
|---|---|---|
| EP | 2 652 086 | 10/2013 |
| WO | 2012/080056 | 6/2012 |

* cited by examiner

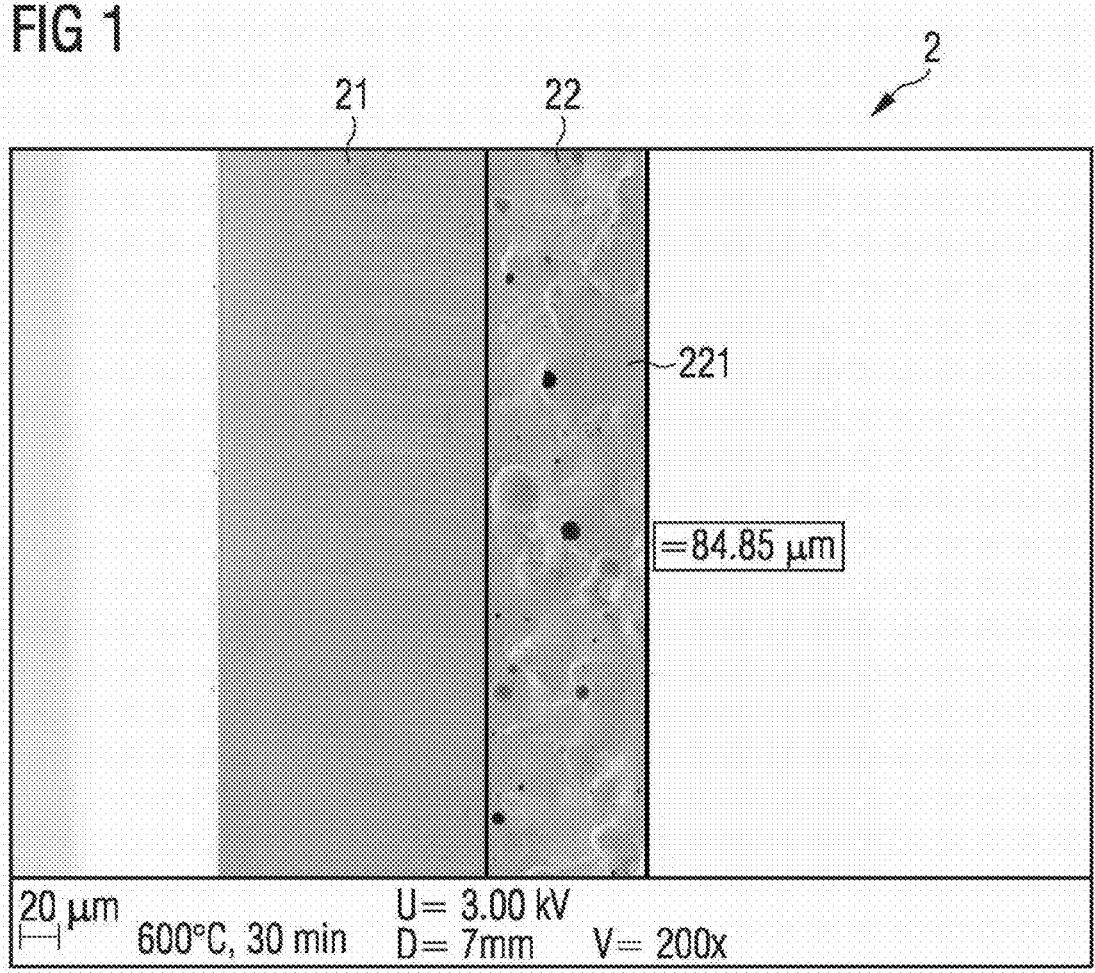

OPTOELECTRONIC COMPONENT AND METHOD OF MANUFACTURING AN OPTOELECTRONIC COMPONENT

TECHNICAL FIELD

This disclosure relates to an optoelectronic component and a method of manufacturing an optoelectronic component.

BACKGROUND

Optoelectronic components such as light emitting diodes (LEDs) require direct or focused light for many applications such as stage lighting or car headlights. It is important that the optoelectronic components have a high luminance for such applications.

Many optoelectronic components have a conversion element in addition to a semiconductor layer sequence. The conversion element is configured to convert the light emitted by the semiconductor layer sequence, especially light with a wavelength in the blue spectral range, into light of a different, usually longer, wavelength. The conversion is performed by at least one conversion material. For many applications, as much light as possible should emerge from a defined emission surface so that the light can be directed via optics, for example, to a specific surface. In other words, the component should have the highest possible luminance Conversion elements can often be formed in the form of small plates and applied to the semiconductor layer sequence using an adhesive. Optionally, the small plates are enclosed with a further material, for example, a silicone filled with $TiO_2$ particles so that no light emerges laterally from the chip or conversion element, but the light exit surface is defined by the surface of the conversion element.

In conventional optoelectronic components, the conversion elements often limit the maximum current density of the LED and thus the maximum luminance In particular, for applications with a high color rendering index (CRI), for example, for a warm white emitting optoelectronic component with a color temperature of 3200 K, for example, it is necessary to combine a combination of a green and red emitting conversion material in the conversion element. So far, however, it has not been possible to provide conversion elements having a high color rendering index (CRI) for warm white light at high current densities of the optoelectronic component, for example, at more than 1 A/mm$^2$ and enable stable operation at the temperatures that occur.

Up to now, conversion elements have been known which, for example, have a polymer matrix material such as silicone in which the conversion material or materials are embedded. However, those conversion elements have low thermal stability.

Furthermore, conversion ceramics are known. However, such conversion ceramics are limited in that often only one type of conversion material can be used. A combination of different types of conversion materials in the conversion ceramics is usually not possible since the conversion ceramics are usually produced at temperatures of more than 1400° C. and different types of conversion materials such as garnet-based and nitride-based phosphors would react with each other, whereby the optical properties such as emission spectrum or quantum efficiency can change. It is therefore not possible to produce conversion ceramics with a high color rendering index for cold or warm white light.

Furthermore, it is in principle possible to embed conversion materials in glass as matrix material. The challenge is to find a suitable glass material that is stable against moisture and radiation and in which the conversion material can be embedded without permanent damage.

Conventional conversion elements have the disadvantage that they have to be relatively thick to guarantee a certain mechanical stability for subsequent handling, for example. Generally, they have a layer thickness of at least 100 µm. This has the disadvantage that heat dissipation is significantly reduced compared to thinner conversion elements. However, heat dissipation is very important for high performance applications because large amounts of heat are generated during operation of the optoelectronic component due to Stokes heat or loss due to the conversion element's quantum efficiency of less than 100% or absorption losses.

It could therefore be helpful to provide an improved optoelectronic, particularly, an optoelectronic component that is stable to high temperatures, humidity and radiation, as well as a method of manufacturing an optoelectronic component that produces an optoelectronic component with improved properties.

SUMMARY

We provide an optoelectronic component including a semiconductor layer sequence having an active region that emits radiation during operation at least via a main radiation exit surface, and a self-supporting conversion element arranged in a beam path of the semiconductor layer sequence, wherein the self-supporting conversion element includes a substrate and a first layer, the first layer includes at least one conversion material embedded in a glass matrix, the glass matrix has a proportion of 50 to 80 vol. % in the first layer, the substrate is free of the glass matrix and the conversion material and mechanically stabilizes the first layer, and the first layer has a layer thickness of less than 200 µm.

We also provide a method of manufacturing the optoelectronic component including a semiconductor layer sequence having an active region that emits radiation during operation at least via a main radiation exit surface, and a self-supporting conversion element arranged in a beam path of the semiconductor layer sequence, wherein the self-supporting conversion element includes a substrate and a first layer, the first layer includes at least one conversion material embedded in a glass matrix, the glass matrix has a proportion of 50 to 80 vol. % in the first layer, the substrate is free of the glass matrix and the conversion material and mechanically stabilizes the first layer, and the first layer has a layer thickness of less than 200 µm including A) providing a semiconductor layer sequence having an active region that, during operation, emits radiation at least via a main radiation exit surface, B) applying a conversion element at least to the main radiation exit surface, the conversion element is self-supporting and is manufactured according to at least B1-B5 before application, B1) mixing at least one conversion material and a glass powder which, after a subsequent glazing step, produces the glass matrix, and optionally further substances such as solvents and binders to produce a paste, B2) applying the paste or dispersion to a substrate to form a first layer, B3) drying the first layer at at least 75° C., B4) heating the substrate and the first layer to a temperature at least as high as the temperature at which the glass matrix of the first layer has a viscosity of 10$^5$ dPa*s, wherein the temperature is greater than 350° C., and B5) treating a surface of the first layer facing away from the substrate, wherein the surface of the first layer facing away from the substrate is smoothed.

We further provide an optoelectronic component including a semiconductor layer sequence having an active region that emits radiation during operation at least via a main radiation exit surface, and a self-supporting conversion element arranged in a beam path of the semiconductor layer sequence, wherein the self-supporting conversion element includes a substrate and a first layer, the first layer includes at least one conversion material embedded in a glass matrix, the glass matrix has a proportion of 50 to 80 vol. % in the first layer, the substrate is free of the glass matrix and the conversion material and mechanically stabilizes the first layer, the first layer has a layer thickness of less than 200 μm, and a surface of the first layer facing away from the substrate is smoothed.

BRIEF DESCRIPTION OF THE DRAWINGS

FIG. 1 shows an electron microscope image according to an example.

Figure 2A:
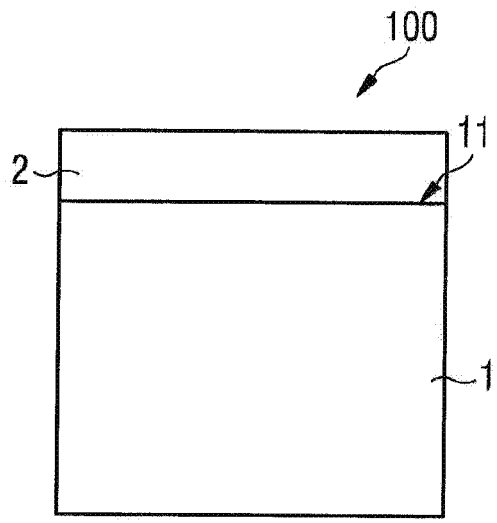
FIGS. 2A to 2G each show an optoelectronic component according to an example.
Figure 2B:
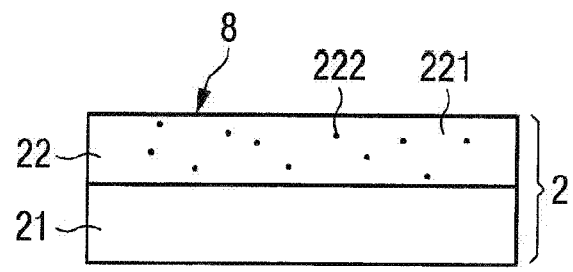

REFERENCE SIGN LIST 100 optoelectronic component
1 semiconductor layer sequence
11 main radiation exit surface
2 conversion element
21 substrate
22 first layer
221 glass matrix
222 conversion material
223 glass matrix
224 conversion material
3 adhesive or adhesive layer
4 sublayer of the first layer
5 sublayer of the first layer
6 potting
7 housing
8 surface of the first layer

DETAILED DESCRIPTION

Our optoelectronic component may have the following characteristics including a semiconductor layer sequence. The semiconductor layer sequence has an active region. During operation, the active area is configured to emit radiation at least via a main radiation exit surface. The component has a conversion element. In particular, a conversion element and the semiconductor layer sequence can be directly connected. The conversion element is self-supporting. The conversion element is arranged in the beam path of the semiconductor layer sequence. The conversion element has a substrate. The conversion element has a first layer. The first layer is particularly arranged on the substrate. In particular, the first layer is arranged downstream of the semiconductor layer sequence, wherein the substrate is arranged downstream of the first layer. Alternatively, the substrate may be arranged downstream of the semiconductor layer sequence, wherein the first layer is arranged downstream of the substrate. The first layer comprises at least one conversion material. The first layer comprises a glass matrix. The conversion material is embedded in the glass matrix. The glass matrix has a proportion of 50 vol. % to 80 vol. % (calculated without pores) in the first layer. The substrate is free of the glass matrix and the conversion material. The substrate is configured to mechanically stabilize the first layer. The first layer has a layer thickness of less than or equal to 200 μm.

The optoelectronic component may have a semiconductor layer sequence. The semiconductor layer sequence is preferably based on a III-V compound semiconductor material. "Based on a nitride compound semiconductor material" means that the semiconductor layer sequence or at least one layer thereof comprises a III-nitride compound semiconductor material, preferably $In_xAl_yGa_{1-x-y}N$, wherein $0 \leq x \leq 1$, $0 \leq y \leq 1$ and $x+y \leq 1$. Thereby, this material does not necessarily have to have a mathematically exact composition according to the above formula. Rather, it may contain one or more dopants and additional components which essentially do not alter the characteristic physical properties of the $In_xAl_yGa_{1-x-y}N$ material. For simplicity's sake, however, the above formula contains only the essential components of the crystal lattice (In, Al, Ga, N), even if they may be partially replaced by small amounts of other substances.

The optoelectronic component contains an active region with at least one pn-junction and/or with one or more quantum well structures. During operation of the optoelectronic component, electromagnetic radiation is generated in the active region. A wavelength or maximum wavelength of radiation is preferably in the ultraviolet and/or visible range, especially at wavelengths of 380 nm to 680 nm, for example, 430 nm to 470 nm.

The optoelectronic component may be a light-emitting diode, or LED for short, or a laser diode. The component may be configured to emit radiation with a dominant wavelength from the UV, blue, green, yellow, orange, red and/or near IR spectral range.

The optoelectronic component may have a conversion element. The conversion element converts the radiation emitted by the semiconductor layer sequence at least partially into secondary radiation. In particular, the secondary radiation has a different wavelength, usually longer, than the wavelength of the radiation emitted by the semiconductor layer sequence.

The conversion element is self-supporting. The term self-supporting describes that the conversion element supports itself and that no further elements are required for support. The conversion element can be applied to the semiconductor layer sequence in the so-called pick-and-place process without further support.

The conversion element may comprise a substrate. The substrate can be glass, glass-ceramic, sapphire or a transparent or translucent ceramic. Preferably, the substrate is glass or sapphire. For example, borosilicate glass such as D263, D263T or D263TECO from Schott or aluminosilicate glass such as AS87 eco from Schott can be used as glass. Alternatively, glass-like materials, polycrystalline aluminum oxide or other transparent or translucent materials can also be used. Preferably, the substrate should have good stability against moisture, radiation and/or high temperatures. Good stability to moisture means, for example, that after a moisture test at 85° C. and 85% relative humidity after 1000 hours there are no significant changes in the mechanical and optical properties, for example, there should be no turbidity or discoloration, the transmission should change by less than 1% of the initial value and there should be no growths such as crystals on the surface. The same applies to stability against radiation (e.g. when irradiated with blue light at 3 W/mm$^2$ for 1000 h) and temperature (e.g. 150° C. for 1000 h).

The substrate can be applied to the main radiation exit surface of the semiconductor layer sequence by an adhesive.

Preferably, however, the first layer is applied to the main radiation exit surface of the semiconductor layer sequence, in particular by an adhesive, as this allows the heat generated to be dissipated better from the first layer.

The substrate may have further coatings that contribute to improved stability, for example, against moisture.

The substrate may be structured. The structuring can be done by laser, applying microlenses to the surface of the substrate or applying photonic crystal lattices to the surface. The surface of the substrate can be modified, for example, by roughening, sandblasting, polishing, grinding, etching or nanolithography. A sapphire substrate with a special surface structure can also be used (PSS, patterned sapphire substrate).

The substrate may have a decoupling foil or decoupling structure. This increases the input and output of radiation and thus efficiency of the optoelectronic component. On the other hand, the decoupling foil or decoupling structure can shape the beam of radiation emitted by the component and direct the beam in a certain direction.

The substrate may have a coating. The coating may, for example, have a scattering layer to increase light extraction. The coating can also be an encapsulation. The encapsulation is intended to protect against environmental influences such as moisture.

When using the component as a flash light, it is also possible to change the surface of the substrate such that, for example, by scattering layers or grinding, the conversion element minimizes or avoids a yellowish optical impression of the conversion element or a different color impression caused by the conversion materials used, for example.

Processing such as grinding or polishing can damage the conversion material and/or matrix material. An additional protective layer or encapsulation can be applied to protect the conversion material and/or matrix material and increase its life. For example, if a phosphor is used as the conversion material which, for example, has a protective layer on the particles to protect them from environmental influences such as moisture, processing such as grinding or polishing can damage this protective layer. A further protective layer can then be applied after the conversion material has been produced to increase stability. The protective layer can also be applied after a separation process, for example, by sawing to also protect the edges of the conversion element. Suitable protective layers are, for example, evaporated layers of e.g. $SiO_2$ and/or $Al_2O_3$, in particular layers applied by atomic layer deposition (ALD), or polymer or hybrid polymer layers of e.g. ormocer, polysilazane, polysiloxane, silicone and/or parylene.

The substrate may comprise functional coatings such as dichroic coatings, interference coatings or anti-reflective coatings. These coatings may have antireflective or filter properties. In addition, the substrate may have a dielectric back reflector on the surface opposite the main radiation exit surface and reflects back some of the radiation that passes through the substrate to achieve a more homogeneous edge emission. The substrate may comprise dielectric filters that reflect at least part of the radiation and thus achieve full conversion. The substrate may have dielectric filters that reflect wavelength-selectively, e.g. preferably part of the blue primary radiation while the secondary radiation is hardly reflected to produce a more homogeneous color location at different angles.

The changes to the substrate can be made individually or in combination so that both the substrate side facing the main radiation exit surface and the opposite substrate side can be changed simultaneously or individually.

The dichroic coating can be applied on the substrate side facing the first layer. In general, a dichroic coating consists of several thin layers with refractive index differences. The dichroic coating can have two main functions, especially if it is applied to the substrate side facing the first layer and the substrate is applied to the semiconductor layer sequence: On the one hand, it ensures a high transmission of the incoming radiation and, on the other hand, a high reflection of the converted light coming from the conversion element. Both effects increase efficiency or effectiveness. This mode of operation is known and will therefore not be explained in detail here. If the first layer is applied to the semiconductor layer sequence, the dichroic coating can be applied to the substrate side facing away from the first layer to reduce reflections at the transition between substrate and air.

The dichroic coating described above can alternatively or additionally be arranged on any other outer side of the substrate and/or on its edge sides.

The substrate may comprise a filter that can selectively absorb wavelengths. For example, the substrate material can be a filter glass such as a short pass, long pass or bandpass filter. This can be particularly advantageous in a full conversion application where the first layer is applied to the semiconductor layer sequence and the substrate absorbs the radiation emitted by the semiconductor layer sequence and transmitted through the first layer so that the light emitted by the component consists almost entirely of secondary radiation.

The surface treatments of the substrate can be applied to the surface of the conversion element accordingly.

The conversion element may have a first layer. The first layer may have a surface facing away from the substrate. The first layer can be structured. The structuring can be done with the same procedures as described for the substrate. For example, the first layer can be polished, ground, etched and/or coated. The surface of the first layer is preferably smooth. This is advantageous if the first layer is applied to the semiconductor layer sequence using an adhesive. A smooth surface enables a thin adhesive layer, for example, with a layer thickness of 500 nm to 15 μm, in particular 1 μm to 10 μm, ideally 2 μm to 7 μm. This enables good heat dissipation from the first layer via the adhesive layer to the semiconductor layer sequence since the adhesive layer usually has a low thermal conductivity and thus represents a heat barrier, especially in a thick layer, whereby heat dissipation from the first layer is limited and the temperature in the first layer is very high, which in turn can lead to lower efficiency of the conversion materials and thus to a lower luminance of the component due to thermal quenchings.

The thickness of the substrate may be 50 μm to 200 μm, preferably 100 to 180 μm. If the substrate is applied to the semiconductor layer sequence, the substrate should be very thin and have the highest possible thermal conductivity to increase the heat dissipation of the heat generated in the conversion element. However, it should also be thick enough so that the conversion element is self-supporting and easy to handle during manufacture.

In particular, the first layer has a homogeneous layer thickness of maximum 140 μm or maximum 130 μm or maximum 120 μm or maximum 110 μm, better maximum 100 μm or preferably maximum 90 μm or maximum 80 μm or maximum 70 μm or maximum 60 μm or maximum 50 μm or maximum 45 μm or maximum 40 μm or maximum 35 μm or maximum 30 μm or maximum 25 μm or maximum 20 μm for partial conversion, ideally from 40 μm to 100 μm. For full conversion, the maximum layer thickness is 250 μm or maximum 220 μm, better maximum 200 μm, preferably maximum 180 µm or maximum 170 µm maximum 160 µm or maximum 150 µm or maximum 100 µm or maximum 90 µm or maximum 80 µm or maximum 70 µm or maximum 60 µm or maximum 50 µm, ideally from 70 µm to 180 µm. Homogeneous means that the layer thickness has a maximum deviation of 20%, or 10%, or 5%, or 3%, or 2%, or 0.5% from the mean layer thickness.

The conversion element may have a conversion material. Alternatively, more than one conversion material, for example, at least two conversion materials, can exist in the conversion element.

At least two different conversion materials may be embedded in the glass matrix.

The conversion material may consist of or contain inorganic phosphors selected from, for example, the following group or combinations thereof: $(Y,Gd,Tb,Lu)_3(Al,Ga)_5O_{12}$:$Ce^{3+}$, $(Sr,Ca)AlSiN_3$:$Eu^{2+}$, $(Sr,Ba,Ca,Mg)_2Si_5N_8$:$Eu^{2+}$, $(Ca,Sr,Ba)_2SiO_4$:$Eu^{2+}$, $\alpha$-SiAlON:$Eu^{2+}$, $\beta$-SiAlON:$Eu^{2+}$, $(Sr,Ca)S$:$Eu^{2+}$, $(Sr,Ba,Ca)_2(Si,Al)_5(N,O)_8$:$Eu^{2+}$, $(Ca,Sr)_8Mg(SiO_4)_4Cl_2$:$Eu^{2+}$, $(Sr,Ba)Si_2N_2O_2$:$Eu^{2+}$.

Conversion materials, e.g. garnets that can be processed at process temperatures of at least 550° C. are preferred. The conversion material may include quantum dots. The conversion material may additionally or alternatively include oxygen-containing or oxygen-free aluminium silicon nitride.

The conversion material may be capable of fully absorbing the radiation of the semiconductor layer sequence and emitting it at longer wavelengths. In other words, a so-called full conversion takes place, i.e. the radiation of the semiconductor layer sequence does not contribute at all or contributes less than 5% to the resulting total radiation.

Alternatively, the conversion material is capable of partially absorbing the radiation of the semiconductor layer sequence so that the total radiation exiting the conversion element is composed of the radiation of the semiconductor layer sequence and the converted radiation. This can also be referred to as partial conversion. The total radiation can be white mixed light. The mixed light can be warm white or cold white.

The first layer may have a thickness of 20 µm to 100 µm for partial conversion. Alternatively, the first layer has a layer thickness of 40 µm to 200 µm for full conversion. In addition, the substrate can be structured, e.g. ground or polished to subsequently adjust the total thickness of the conversion element.

More than two conversion materials can exist in the conversion element. This means that a color location or the color rendering index can be adjusted. By combining a green and red conversion material, for example, it is possible to produce warm white mixed light with a high color rendering index.

By using at least two types of conversion material, the emission spectrum can be adjusted accordingly and a desired CRI and R9 value can be obtained. Usually the conversion material has particles with different particle size distributions. When using multiple conversion materials, we found that appropriate particle size adjustment can be critical to achieve the densest possible packing and thus a compact conversion element with good thermal conductivity. Alternatively, particles of a conversion material of different sizes can also be mixed to produce the densest sphere packing.

A layer effect can be created by sedimentation of the conversion materials. The different sedimentation rates of the conversion materials can be exploited. The different sedimentation rate results from the different particle size, shape and/or density of the conversion material. Such an arrangement can lead to a better heat dissipation, to a reduced intensity quenching, for example, of a red emitting conversion material, or to a change of the CRI or R9 value. This may be caused by different reabsorption of the conversion materials.

The first layer may have several sublayers. In other words, the first layer can be formed such that the first layer has several conversion materials arranged in different sublayers. The conversion materials can be embedded in the same or different glass matrix materials of the respective sublayers.

The conversion element may be manufactured from several layers that can vary in layer thickness, compactness, glass matrix, conversion material, spreaders and/or fillers.

The conversion material can be spherical. This allows a high filling level of conversion material to be achieved in the first layer, thus creating a compact first layer. Preferably, the conversion element is thin. The conversion element has a scattering caused by enclosed pores and refractive index differences between the glass matrix, the conversion material and, if necessary, pores.

The compactness of the first layer can be adjusted not only by the component ratios, but also during production by selecting suitable process parameters such as drying or heating, or controlling the humidity or a temperature ramp.

The compactness of the first layer can also be influenced by the size and shape of the conversion materials, the size and shape of the glass matrix if powdered, and the ratio between conversion material and matrix material. A first layer that is as compact as possible with a surface that is as closed as possible is advantageous if the first layer is applied to the semiconductor layer sequence by adhesive so that little adhesive gets into the pores of the first layer.

The component can be used for stage lighting, flash lighting, automotive applications (e.g. headlights, turn signals, brake lights), lamps, displays, endoscopes, business lighting and/or stadium lighting.

The conversion element may comprise scattering particles or fillers. The scattering particles or fillers can be, for example, aluminium oxide, aluminium nitride, barium sulphate, boron nitride, magnesium oxide, titanium dioxide, silicon dioxide, silicon nitride, YAG, orthosilicate, zinc oxide or zirconium dioxide as well as AlON, SiAlON or combinations or derivatives thereof or other ceramic as well as vitreous particles, metal oxides or other inorganic particles. The scattering particles or fillers may be of different shapes such as spherical, rod-shaped or disc-shaped, wherein the particle sizes can range from a few nanometres to a few tens of micrometres.

The conversion material may be homogeneously distributed in the glass matrix. Alternatively, the conversion material can have a concentration gradient in the glass matrix, for example, an increase in the concentration of the conversion material in the direction away from the semiconductor layer sequence. For example, larger particles can be located closer to the substrate and smaller particles can be located on the surface of the conversion element, i.e. on the side facing away from the substrate. This reduces backscattering. In particular, the backscattering of the blue light, i.e. the light emitted by the semiconductor layer sequence can be reduced. This reduces the amount of blue radiation that hits back the semiconductor layer sequence. This can offer an efficiency advantage since part of the light is usually absorbed in the semiconductor layer sequence or at adjacent layers such as a mirror coating.

The conversion element may have surfaces that are smoothed or planarized. This can be done, for example, by grinding or polishing. This can, for example, reduce the layer thickness of the adhesive layer that connects the conversion element and the semiconductor layer sequence and produce a better thermal connection.

The conversion material may be formed as particles, with the particles of the conversion material having a size distribution and a mean diameter. The mean diameter (d50 value) can be 0.5 µm to 50 µm, preferably 2 µm to 40 µm, especially 3 µm to 25 µm. There may also be different conversion materials with different emission spectra.

The polishing, grinding and/or structuring step can grind the particles of the conversion material and thus damage them. Therefore, after this structuring and/or polishing or grinding, a protective layer or encapsulation can be applied to increase the stability of the conversion material. If, for example, a fluorescent material is used as a conversion material which, for example, has a protective layer on the particles to protect them against environmental influences such as moisture, processing such as grinding or polishing can damage this protective layer. A further protective layer can then be applied after the conversion material has been produced to increase stability. The protective layer can also be applied after a separation process, for example, by sawing to also protect the edges of the conversion element. Suitable protective layers are, for example, evaporated layers of e.g. $SiO_2$ and/or $Al_2O_3$, in particular layers applied by atomic layer deposition (ALD), or polymer or hybrid polymer layers of e.g. ormocer, polysilazane, polysiloxane, silicone and/or parylene.

The conversion element may have a certain porosity. A material e.g. a polymer such as silicone or polysilazane, or generally a material with low light absorption in the wavelength range of the excitation wavelength or the converted light, can be introduced into the pores.

In addition, a coating can be applied to the conversion element to close the pores of the conversion element. The coating may have the same material as the glass matrix of the first layer. The coating may also comprise a filler. In addition or alternatively, the edges of the conversion element can be coated, for example, by molding or casting. Silicone with titanium dioxide particles, for example, can be applied to the edges of the conversion element for this purpose.

Between the substrate and the first layer there may be other layers, for example, protective layers that can protect the substrate from a hard conversion material to prevent the substrate from being damaged during the coating process and prevent scratches, cracks or microcracks from forming. A protective layer can be aluminum oxide or silicon dioxide, for example.

The lateral expansion of the conversion element can be 1 mm×1 mm or approximately 1.3 mm×1.5 mm, for example. In principle, however, other dimensions are also possible. The total thickness of the conversion element can be 30 µm to 2 mm, preferably 50 µm to 500 µm, and particularly preferably 100 µm to 250 µm.

In addition, the conversion element may have regions where there are recesses, for example, to release a bond pad when attaching the conversion element to the semiconductor layer sequence, via the bond pad the semiconductor layer sequence is electrically contacted. This region can be generated subsequently. This can be done mechanically, for example, by sawing or laser cutting.

Laterally structured layers may be produced that can vary in thickness, compactness, matrix material, conversion material, scatterer and filler. This allows, for example, the use of different first layers with different conversion materials and/or glass matrices arranged side-by-side over one or more semiconductor layer sequences. This can be advantageous, for example, if conversion materials are used that are not introduced together into a glass matrix without damaging at least one of the conversion materials, but instead a separate suitable glass matrix must be used for each conversion material.

The substrate can be removed after applying the conversion element to the main radiation exit surface. Removal can be done by liftoff or other processes such as chemical dissolution or mechanical or thermal removal. Alternatively, a sacrificial layer between substrate and first layer can be used instead of liftoff, wherein the sacrificial layer is modified chemically, thermally or by radiation in such a way that removal of the substrate is possible.

The conversion element can also be formed without a substrate. This means that the substrate is removed after application to the semiconductor layer sequence. Very thin conversion elements can be produced by subsequently removing the substrate.

The first layer may comprise a glass matrix. The glass matrix preferably comprises 50 to 80 vol. % in the first layer. The glass matrix has good moisture stability. Good means in particular that after a storage test at 85° C. and 85% relative humidity after 1000 hours the matrix shows no significant changes in the mechanical and optical properties, for example, no turbidity or discoloration should show, the transmission should change by less than 1% of the initial value and there should be no growths such as crystals on the surface.

The proportion of the glass matrix in the first layer is greater than 0 vol. % and less than 100 vol. %, preferably 50 to 80 vol. % (limits included), for example, 40 or 45 vol. %, 50 or 51 vol. %, 52 or 53 vol. %, 54 or 55 vol. %, 56 or 57 vol. %, 58 or 59 vol. %, 60 or 61 vol. %, 62 or 63 vol. %, 64 or 65 vol. %, 66 or 67 vol. %, 68 or 70 vol. %, 71 or 72 vol. %, 73 or 74 vol. %, 75 or 76 vol. %, 77 or 78 vol. %, 79 or 80 vol. %, 81 or 82 vol. %, 83 or 84 vol. %, 85 or 86 vol. %, 90 or 95 vol. %. The proportion of conversion material in the first layer can be 0 vol. % to 100 vol. %, preferably 20 to 50 vol. %, for example, 20, 22, 25, 28, 30, 32, 35, 38, 40, 45, 48 or 50 vol. %.

The first layer may have a layer thickness of <200 µm. Preferably the layer thickness is ≤150 µm or ≤100 µm.

The layer thickness of the first layer may be a maximum of 200 µm for full conversion or maximum of 150 µm for partial conversion.

The substrate may have a higher softening temperature than the softening temperature of the glass matrix. This means that the first layer applied as a dispersion can be baked, sintered and/or glazed without the substrate deforming.

The glass matrix may be a tellurite glass, a silicate glass, an aluminosilicate glass, a borate glass, a borosilicate glass or a phosphate glass.

The substrate may be located between the main radiation exit surface and the first layer. Between the substrate and the main radiation exit surface a layer, for example, an adhesive layer, can be additionally arranged. Alternatively, the substrate can be applied directly to the main radiation exit surface.

The first layer may preferably be located between the main radiation exit surface and the substrate. This arrangement is advantageous because the heat generated during operation in the first layer is generated closer to the semiconductor layer sequence, which is connected to a heat sink, and can therefore be dissipated more easily. A layer such as an adhesive layer can be additionally arranged between the substrate and the main radiation exit surface.

The first layer may have a surface facing away from the substrate. The surface is preferably surface-treated. Surface treatment means in particular that the surface is smoothed. Smoothing can be done by polishing, grinding, etching or general structuring or coating.

The self-supporting conversion element may be arranged on the main radiation exit surface by an adhesive. The adhesive can be inorganic or organic. For example, the adhesive is a silicone. The main radiation exit surface is the surface of the semiconductor layer sequence perpendicular to the growth direction of the semiconductor layer sequence and facing the conversion element.

The adhesive may be a silicone and the self-supporting conversion element is free of the silicone.

The adhesive can also be the same glass matrix material as the glass matrix materials for the conversion element if the glass matrix material softens at a temperature at which the optoelectronic component, for example, the semiconductor layer sequence, is not yet thermally permanently damaged. The adhesive can be a sol-gel material such as aluminium phosphate, modified monoaluminium phosphate, monoaluminium phosphate or water glass, a low-melting glass or a polymer. The adhesive may contain fillers.

The glass matrix may be oxidic and contains at least one of the following materials: Lead oxide, bismuth oxide, boron oxide, silicon dioxide, phosphorus pentoxide, aluminium oxide, tellurium dioxide or zinc oxide or comprises them. The glass matrix preferably comprises zinc oxide. Preferably the glass matrix is free of lead oxide. The materials may be present individually or in combination in the glass matrix.

The glass matrix may comprise or consist of zinc oxide (ZnO), boron trioxide ($B_2O_3$) and silicon dioxide ($SiO_2$).

The glass matrix may comprise zinc oxide, at least one glass former and a network converter or an intermediate oxide. The glass former can be boric acid, silicon dioxide, phosphorus pentoxide, germanium dioxide, bismuth oxide, lead oxide and/or tellurium dioxide. The network converter or intermediate oxide may be selected from the following group or combinations thereof: alkaline earth oxide, alkali oxide, aluminium oxide, zirconium oxide, niobium oxide, tantalum oxide, tellurium dioxide, tungsten oxide, molybdenum oxide, antimony oxide, silver oxide, tin oxide, rare earth oxides.

The glass matrix may be a tellurite glass.

The glass matrix may have a proportion of at least 60 vol. % in the first layer.

The optoelectronic component may comprise an adhesive layer. The adhesive layer is preferably located between the conversion element and the main radiation exit surface. The adhesive layer has a thickness of 500 nm to 50 µm, preferably 500 nm to 5 µm. The adhesive layer should be as thin as possible, for example, 500 nm, 1 µm, 2 µm, 3 µm, 4 µm or 5 µm, to achieve good heat dissipation. Adhering can be carried out using an inorganic or organic adhesive, preferably with the side facing away from the substrate. Preferably, the substrate is transmissive.

The conversion element may be inorganic. In other words, the conversion element has only inorganic components and is free of organic materials. For example, the conversion element does not contain silicone.

We recognized that advantageous properties can be achieved by combining a semiconductor layer sequence with a conversion element. The conversion element comprises or consists of one or more conversion materials embedded in a glass matrix. The conversion material and the glass matrix form the first layer, which is arranged on a substrate. The conversion element can have very thin layers and be highly filled with the conversion material. In other words, the first layer is applied to the substrate, wherein the glass matrix can be processed at low viscosity and can therefore be thinner and filled higher with the conversion material than a conversion element formed without substrate. In a conversion element without substrate, the shape would be lost due to the surface tension if the glass matrix became too low viscous. The conversion element exhibits scattering due to pores and/or refractive index differences, which can be more easily varied and adjusted than with other inorganic matrix materials, since the glass matrix retains a certain residual porosity. In other words, the glass matrix is low in porosity, but is usually never completely free of pores. The surface of the conversion element is largely closed and relatively smooth. The substrate and the matrix material have good moisture stability.

The optoelectronic components offer numerous advantages:

An optoelectronic component with a high color rendering index at significantly higher operating current can be provided compared to conversion elements with silicone as matrix material. High performance warm white and cold white optoelectronic components can be provided. In addition, the optoelectronic components can be used for other color locations or for full conversion applications. Adjustment of the color location and the color rendering index of the emitting radiation for high-power applications, which are usually not usual and are not possible with ceramic converters, for example, can be done. A higher luminance and higher luminous flux per chip area compared to optoelectronic components using silicon as matrix material can be provided with the components. A higher operating performance due to better heat dissipation can be used in comparison to organic matrix materials such as silicone. In addition, these optoelectronic components can be operated at higher operating temperatures compared to components with silicone as matrix material since conventional components with silicone as matrix material already degrade at 160 to 180° C. In addition, several optoelectronic components can be manufactured simultaneously. This reduces production costs and production time.

A substrate with a thermal expansion coefficient may be used such that the conversion element shows only a small distortion, preferably no distortion after the glazing process during production due to temperature change. Separation can be done by sawing, scribing and breaking or by various laser cutting techniques such as laser sublimation cutting or stealth dicing.

We also provide a method of manufacturing an optoelectronic component. The optoelectronic component is preferably manufactured using this method. All definitions and examples for the optoelectronic component also apply to the method and vice versa.

The method of manufacturing an optoelectronic component may comprise the steps:

A) providing a semiconductor layer sequence having an active region which, during operation, emits radiation at least via a main radiation exit surface, B) applying of a conversion element at least to the main radiation exit surface, the conversion element is self-supporting and is manufactured as follows prior to application:

B1) mixture of at least one conversion material and a glass powder and optionally further substances such as solvents and binders to form a dispersion, B2) applying the dispersion to a substrate to form a first layer, B3) drying the first layer at at least 75° C., B4) heating the substrate and the first layer to a temperature at least as high as the temperature at which the glass matrix of the first layer has a viscosity of $10^5$ dPa*s (pour point), wherein the temperature is greater than 350° C., and B5) optionally treating a surface of the first layer facing away from the substrate.

Dispersion means a heterogeneous mixing of at least two components. Mixing can be carried out manually, for example, or by a speed mixer, three-roll mill or roller block.

Dispersion also includes a paste or suspension of a conversion material powder and a glass matrix powder in a solvent. Binders (e.g. polypropylene carbonate, cellulose) or other additives may also be present. For example, a dispersant (e.g. ammonium polymethacrylate) or a plasticizer (e.g. propylene carbonate) may be present.

Step B5 can be carried out optionally. Treatment in step B5 can, for example, be smoothing. Smoothing can be done by polishing or grinding. Step B5 is preferably carried out when the first layer faces the main radiation exit surface because smoothing or treating the surface of the first layer can be advantageous to form the adhesive layer as thin as possible and thus achieve better heat dissipation. However, the surface of the first layer can also be treated by applying another coating such as an anti-reflective coating. The temperature described in step B4 is preferably above 350° C.

Step B2 may be carried out by doctoring, screen printing, stencil printing, film casting, spin coating, dispensing or spray coating.

Compared to conversion elements comprising silicone as a matrix material, our conversion elements exhibit high thermal conductivity, better temperature stability and higher stability against radiation. Our conversion element shows a better heat dissipation especially with such layer thicknesses of the conversion elements compared to conversion elements with silicone as matrix. In addition, scattering can be better controlled by adjusting the refractive index than with silicone as the matrix material. For example, scattering can be reduced by reducing the refractive index difference between the glass matrix of the first layer and the conversion material, for example, to a refractive index difference of <0.3 or ≤0.2 or ≤0.15 or ≤0.1.

Compared to conventional conversion elements, our conversion elements can be formed much thinner and with a higher filling degree of the conversion material. In addition, our conversion elements have a substrate to ensure sufficient mechanical stability. This allows easy mechanical handling during application of the conversion element to the main radiation exit surface. The substrate is preferably transmissive (transparent or translucent). Preferably, the first layer is applied to the main radiation exit surface. This is advantageous for good heat dissipation to the semiconductor layer sequence and thus serves as a heat sink.

The conversion element can be applied to the substrate by, for example, doctoring, screen printing, stencil printing, dispensing, spray coating, film casting, spin coating, electrophoretic deposition or other methods or combinations of such methods.

The component can be used for stage lighting, flash lighting, automotive lighting, lamps, displays, brake lights, endoscopes, business lighting and/or stadium lighting.

Several components can be produced at the same time. This can be done, for example, by coating a larger substrate and subsequently separating the substrate to produce several optoelectronic components or conversion elements. Separation can be done by sawing, scribing and breaking or various laser cutting techniques such as laser sublimation cutting or stealth dicing. This improves or reduces homogeneity, yield and production costs.

If the substrate has good thermal conductivity, it is also possible to apply the conversion element to the main radiation exit surface on the substrate side using an adhesive. Due to its good thermal conductivity, the substrate does not act as a thermal barrier here.

A further protective layer or encapsulation can be applied to protect the conversion material and/or matrix material and increase the service life. This can be particularly advantageous if the conversion material and/or matrix material has been damaged during processing such as grinding or polishing. If, for example, a phosphor is used as a conversion material which, for example, has a protective layer on the particles to protect them from environmental influences such as moisture, processing such as grinding or polishing can damage this protective layer. A further protective layer can then be applied after the conversion material has been manufactured to increase stability. The protective layer can also be applied after a separation process, for example, by sawing to also protect the edges of the conversion element. Suitable protective layers are, for example, evaporated layers of e.g. $SiO_2$ and/or $Al_2O_3$, in particular layers applied by atomic layer deposition (ALD), or polymer or hybrid polymer layers of e.g. ormocer, polysilazane, polysiloxane, silicone and/or parylene.

Between the substrate and the first layer there may be other layers, for example, protective layers that can protect the substrate from a hard conversion material to prevent the substrate from being damaged during the coating process and prevent formation of scratches, cracks, microcracks or serve as diffusion barriers for e.g. alkali oxide from the substrate. A protective layer can be made of aluminum oxide or silicon dioxide, for example.

The conversion material may have a proportion in the first layer of 0 to 50 vol. %, preferably 20 to 50 vol. %.

Glasses can be used as the glass matrix. Oxidic glasses are preferred. Oxidic glasses can be, for example, but not limited to, silicate glasses, borate glasses, borosilicate glasses, aluminosilicate glasses, phosphate glasses, tellurite glasses or germanate glasses. In addition, optical glasses or glasses that have a low transformation temperature, so-called "low Tg" glasses, can also be used.

For example, glasses containing lead oxide can be used as glasses such as mixtures of lead oxide and boron oxide ($PbO$—$B_2O_3$) or lead oxide and silicon dioxide ($PbO$—$SiO_2$) or lead oxide, boron oxide and silicon dioxide ($PbO$—$B_2O_3$—$SiO_2$) or lead oxide, boron oxide, zinc oxide ($PbO$—$B_2O_3$—$ZnO$) or lead oxide, boron oxide and aluminium oxide ($PbO$—$B_2O_3$—$Al_2O_3$).

The lead oxide glasses may also contain bismuth oxide or zinc oxide. These glasses may also contain alkaline earth oxides, alkali oxides, aluminium oxide, zirconium oxide, titanium dioxide, hafnium dioxide, niobium oxide, tantalum oxide, tellurium dioxide, tungsten oxide, molybdenum oxide, antimony oxide, silver oxide, tin oxide and/or other rare earth oxides.

The glass matrix may be free of lead or lead oxide. Glasses containing bismuth oxide, for example, can be used. For example, glasses may be used that contain bismuth oxide and boron oxide ($Bi_2O_3$—$B_2O_3$) or bismuth oxide, boron oxide, silicon dioxide ($Bi_2O_3$—$B_2O_3$—$SiO_2$) or bismuth oxide, boron oxide, zinc oxide ($Bi_2O_3$—$B_2O_3$—$ZnO$) or bismuth oxide, boron oxide, zinc oxide and silicon oxide ($Bi_2O_3$—$B_2O_3$—$ZnO$—$SiO_2$). The glasses containing bismuth oxide may also contain other glass components such as alkaline earth oxides, alkali oxides, aluminium oxide, zirconium oxide, titanium dioxide, hafnium oxide, niobium oxide, tantalum oxide, tellurium dioxide, tungsten oxide, molybdenum oxide, antimony oxide, silver oxide, tin oxide and/or other rare earth oxides.

Alternatively, lead oxide free glasses such as glasses containing zinc oxide can also be used. For example, zinc oxide and boron oxide ($ZnO$—$B_2O_3$) or zinc oxide, boron oxide and silicon dioxide ($ZnO$—$B_2O_3$—$SiO_2$), zinc oxide and phosphorus pentoxide ($ZnO$—$P_2O_5$) or zinc oxide, tin oxide and phosphorus pentoxide ($ZnO$—$SnO$—$P_2O_5$) or zinc oxide and tellurium dioxide ($ZnO$—$TeO_2$) can be used as glass matrix.

The glasses containing zinc oxide may contain further components such as alkaline earth oxides, alkali oxides, aluminium oxide, zirconium oxide, titanium oxide, hafnium oxide, niobium oxide, tantalum oxide, tellurium dioxide, tungsten oxide, molybdenum oxide, antimony oxide, silver oxide, tin oxides and/or other rare earth oxides.

The glass matrix may have a softening temperature, preferably 150-1000° C., better 150-950° C., in particular 200-800° C., ideally 300-700° C. or 350-650° C. At the softening temperature, the glass has a viscosity of $10^{7.6}$ dPa*s as defined in ISO 7884. In addition, the glass matrix has a viscosity of $10^5$ dPa*s at 150 to 1400° C., especially 250-1200° C., for example, 250-650° C. or 600-1200° C. (limits included in each instance).

In particular, the upper temperature limit for the manufacture of the conversion element does not exceed 1400° C., or ≤1350° C., or ≤1300° C., or ≤1250° C., or ≤1200° C., or ≤1150° C., or ≤1100° C., or ≤1050° C., or ≤1000° C., or ≤950° C., or ≤900° C., or ≤850° C., or ≤800° C., or ≤700° C., or ≤650° C., or ≤600° C., or ≤550° C. This also depends on the softening temperature of the substrate, which should not be exceeded.

The glass matrix may contain zinc oxide and belongs to the system zinc oxide, boron oxide and silicon dioxide ($ZnO$—$B_2O_3$—$SiO_2$), bismuth oxide, boron oxide, zinc oxide and silicon dioxide ($Bi_2O_3$-$B_2O_3$—$ZnO$—$SiO_2$) and/or zinc oxide and tellurium dioxide ($ZnO$—$TeO_2$). The refractive index of zinc-oxide-boron-oxide-silicon-dioxide is about 1.6. The refractive index for bismuth oxide, boron oxide, zinc oxide and silicon dioxide as a glass matrix is about 2.0, the glass matrix with tellurium dioxide with zinc oxide is also highly refractive and is about 1.9. Preferably, the conversion element is very stable to moisture.

To use such optoelectronic components for the automotive industry, it is advantageous if these components have a high moisture stability, for example, a stability at 1000 hours at 85° C. with 85% relative humidity. Preferably, tellurite glasses or silicate glasses or borate glasses containing silicon dioxide are used as glass matrix. The silicon dioxide content of borate glasses is preferably ≥1 mol % and ≤20 mol %, preferably ≥3 mol %, preferably ≥5 mol %. It is also possible to use silicate glasses with a silicon dioxide content of ≥20 mol %, or ≥25 mol %, or ≥30 mol %, or ≥35 mol %, or ≥40 mol %, or ≥45 mol %, or ≥50 mol %, or ≥55 mol %, or ≥60 mol %, or ≥65 mol %, or ≥70 mol %, or ≥75 mol %, or ≥80 mol %. Preferably the glasses contain zinc oxide with a proportion of at least 1 mol %, i.e. the component has not been introduced via raw material impurities, but purposefully, and a maximum of 50 mol %. Aluminosilicate glasses, for example, an alkaline earth aluminosilicate glass, can also be used.

Further advantages and further developments result from the examples described in the following in connection with the figures.

In the examples and figures, identical, similar or similarly acting elements can each be provided with the same reference signs. The elements shown and their proportions are not to be regarded as true to scale. Rather, individual elements such as layers, devices, components and regions can be displayed exaggeratedly large for better representability and/or better understanding.

In the following, various examples of the optoelectronic component are shown, which comprise a different glass matrix 221.

Example 1: $ZnO$—$B_2O_3$—$SiO_2$ as Glass Matrix 221 (Refractive Index Approx. 1.6)

A paste made with a powder of a glass consisting of zinc oxide, boron oxide, silicon dioxide and aluminium oxide, a garnet as a conversion material powder and a conventional screen printing medium consisting of a binder and a solvent was produced and then applied to the substrate by one of the usual coating methods. The coating can be carried out, for example, by doctoring or screen printing or stencil printing with a wet layer thickness of 30 to 200 μm, preferably 50 to 150 μm, in particular 60 to 130 μm. After drying, the conversion element can be tempered at a temperature of 600° C., for example. After tempering, the conversion element 2 may contain a conversion material 222 with a proportion of 25 vol. %.

In particular, aluminium oxide is only present in small quantities. Aluminium oxide is not included in the above formula.

FIG. 1 shows an example of a scanning electron microscope image (SEM) of a conversion element 2 according to an example. The layer thickness of the conversion element 2 is approximately 85 μm after a tempering temperature of approximately 600° C. for thirty minutes. The conversion material 2 has a content of approximately 22 vol. % in the first layer 22. A borosilicate glass with good chemical resistance was used as substrate 21.

The measured quantum efficiency of the example in FIG. 1 is about 98% (absolute value). The measured absorption was 1.8% in a wavelength range of 680 to 720 nm. Both values show that the conversion elements 2 have excellent properties in the optoelectronic components 100. Quantum efficiency and absorption were measured with a Hamamatsu-Quantaurus setup.

Example 2: $ZnO$—$B_2O_3$—$SiO_2$ as Glass Matrix 221 (Refractive Index About 1.6)

A paste was produced from a glass powder according to Example 1, YAGaG as conversion material in powder form and a conventional screen printing medium and then applied to a borosilicate glass as substrate. The application was done by doctoring. The substrate has good chemical resistance. The gap height of the doctor blade was 100 μm. The substrate thickness was approximately 0.7 mm After drying at 80° C. the conversion element was tempered at 600° C. for one minute and heated at a heat rate of 10 K/min. After the tempering step, the conversion element contained a conversion material content of 28 vol. % (calculated without pores) and a layer thickness of approximately 20 μm of the first layer 22.

Example 3: ZnO—B$_2$O$_3$—SiO$_2$ as Glass Matrix
(Refractive Index About 1.6)

Example 3 was manufactured similar to Example 2 and tempered at a temperature of 600° C. for thirty minutes. The thickness of the tempered first layer is approximately 20 µm.

Example 4: ZnO—B$_2$O$_3$—SiO$_2$ as Glass Matrix
(Refractive Index Approx. 1.6)

Example 4 was manufactured similar to Example 3, but with a gap height of 60 µm. The thickness of the tempered first layer is approximately 13 µm.

The luminance of the Examples 2, 3, and 4 was measured at 1000 mA. Example 3 shows the best values and is comparable to the luminances of ceramic converters.

The FIGS. 2A to 2G each show a schematic side view of an optoelectronic component 100 according to an example.

The optoelectronic component 100 of FIG. 2A has a semiconductor layer sequence of 1. The semiconductor layer sequence 1, for example, can be made of InAlGaN. The semiconductor layer sequence 1 has an active region that emits radiation during operation at least via a main radiation exit surface 11. For example, the semiconductor layer sequence 1 emits radiation from the blue spectral range. A conversion element 2 is arranged directly on the main radiation exit surface 11. Alternatively, between the conversion element 2 and the semiconductor layer sequence 1, further layers can be arranged, for example, an adhesive layer 3 as shown in FIGS. 2D to 2G.

The conversion element 2 has a first layer 22 arranged on a substrate 21. The arrangement can be direct or indirect. Direct means that no further layers or elements are placed between the first layer 22 and the substrate 21 (see FIG. 2B). The first layer 22 may have a glass matrix 221. At least one conversion material 222 can be embedded in the glass matrix 221. More than one conversion material 222 may also be embedded in the glass matrix 221. Conversion material 222 can be any material configured to convert the radiation emitted by the semiconductor layer sequence 1 into radiation with a changed, usually longer, wavelength.

The first layer 22 may have a structured surface 8 facing away from the substrate 21. Structuring can be carried out by polishing, grinding, etching or coating.

Figure 2C:
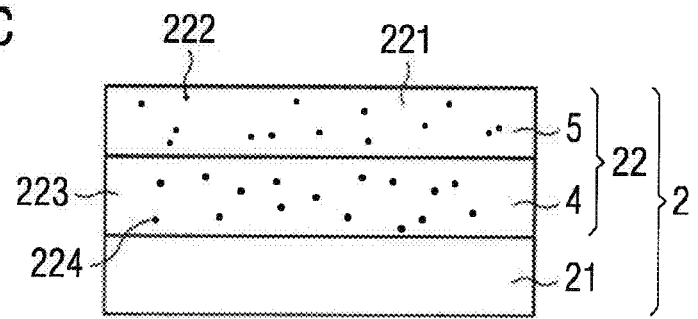

As shown in FIG. 2C, the conversion element 2 may have not only a first layer 22, but the first layer 22 may be formed by further sublayers 4 and 5. Conversion materials 222, 224 can be arranged in each of the sublayers 4, 5. The conversion materials 222, 224 can be the same or different. The conversion materials 222, 224 are each embedded in a glass matrix 221, 223. The glass matrix 221, 223 can, for example, be a tellurite glass. The glass matrix 221, 223 of sublayer 4 and sublayer 5 can be the same or different. The sublayers 4, 5 can be arranged on the substrate 21. The substrate 21 can be glass, glass ceramic, sapphire or ceramic.

Figure 2D:
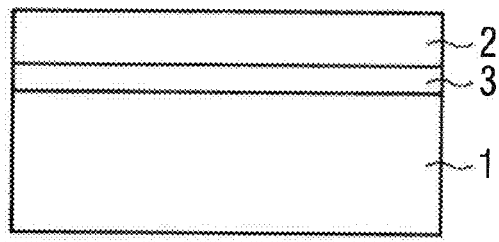

FIG. 2D shows that an adhesive layer 3 is arranged between the semiconductor layer sequence 1 and the conversion element 2.

Figure 2E:
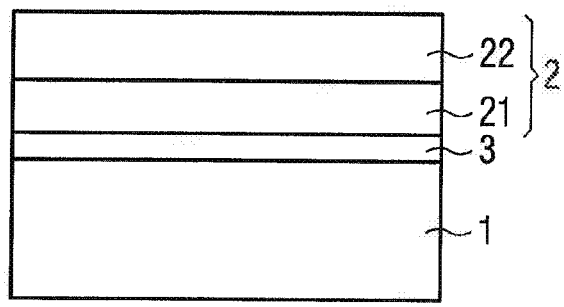

As shown in FIG. 2E, the substrate 21 may be located between the main radiation exit surface 11 and the first layer 22. The substrate 21 can therefore be located directly downstream of the adhesive layer 3 or of the main radiation exit surface 11.

Figure 2F:
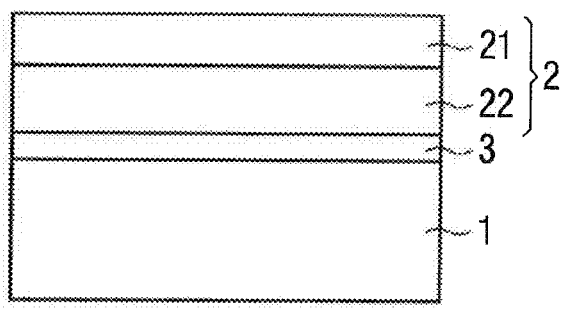

Alternatively, as shown in FIG. 2F, the first layer 22 may be located between the main radiation exit surface 11 and the substrate 21. Thus, the first layer 22 may be located directly downstream of the adhesive layer 3 or of the main radiation exit surface 11.

Figure 2G:
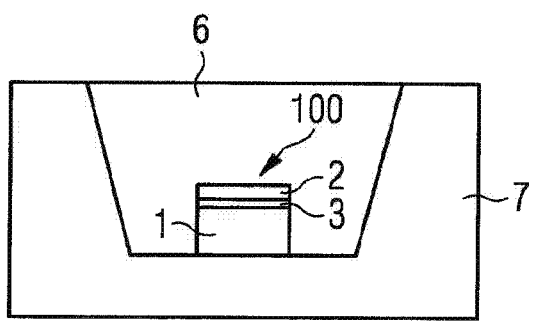

FIG. 2G shows the arrangement of the optoelectronic component 100 in a housing 7. The housing can have a recess in which the optoelectronic component 100 is arranged. The recess can be filled with a 6 potting material, for example, silicone or another inorganic potting material. The potting 6 can also contain fillers such as TiO$_2$ particles. The housing 7 can also only be partially filled with the potting 6, for example, up to the upper edge of the optoelectronic component 100.

The examples described in connection with the figures and their features can also be combined with each other according to further examples, even if such combinations are not explicitly shown in the figures. Furthermore, the examples described in connection with the figures may have additional or alternative features according to the description.

Our components and methods are not limited by the description in conjunction with the examples. Rather, this disclosure comprises any new feature as well as any combination of features, particularly including any combination of features in the appended claims, even if the feature or combination per se is not explicitly stated in the claims or examples.

This application claims priority of DE 10 2017 104 133.8, the subject matter of which is incorporated herein by reference.

The invention claimed is:

1. An optoelectronic component comprising:
    a semiconductor layer sequence having an active region that emits radiation during operation at least via a main radiation exit surface, and
    a self-supporting conversion element arranged in a beam path of the semiconductor layer sequence,
    wherein the self-supporting conversion element comprises a substrate and a first layer,
    the first layer comprises at least one conversion material embedded in a glass matrix,
    the glass matrix has a proportion of 50 to 80 vol. % in the first layer,
    the substrate is free of the glass matrix and the conversion material and mechanically stabilizes the first layer,
    the first layer has a layer thickness of less than 200 µm, and
    the glass matrix is oxidic and comprises at least one selected from the group consisting of lead oxide, bismuth oxide, boron oxide, silicon dioxide, tellurium dioxide, phosphorus pentoxide, aluminum oxide and zinc oxide.

2. The optoelectronic component according to claim 1, wherein the substrate is glass, glass-ceramic, ceramic or sapphire.

3. The optoelectronic component according to claim 1, wherein the substrate is located between the main radiation exit surface and the first layer.

4. The optoelectronic component according to claim 1, wherein the first layer is located between the main radiation exit surface and the substrate.

5. The optoelectronic component according to claim 1, wherein the first layer has a surface facing away from the substrate which is surface-treated.

6. The optoelectronic component according to claim 1, wherein the self-supporting conversion element is arranged on the main radiation exit surface by an adhesive.

7. The optoelectronic component according to claim 1, wherein the glass matrix comprises ZnO, $B_2O_3$ and $SiO_2$.

8. The optoelectronic component according to claim 1, wherein the glass matrix comprises ZnO, at least one glass former and a network converter or an intermediate oxide comprising at least one selected from the group consisting of alkaline earth oxide, alkali oxide, aluminum oxide, zirconium oxide, niobium oxide, tantalum oxide, tellurium dioxide, tungsten oxide, molybdenum oxide, antimony oxide, silver oxide, tin oxide, and rare earth oxide.

9. The optoelectronic component according to claim 1, wherein the glass matrix is a tellurite glass, a silicate glass, an aluminosilicate glass, a borate glass, a borosilicate glass or a phosphate glass.

10. The optoelectronic component according to claim 1, wherein the glass matrix has a proportion of at most 75 vol. % in the first layer.

11. The optoelectronic component according to claim 1, wherein the at least one conversion material is selected from the group consisting of $(Y,Gd,Tb,Lu)_3(Al,Ga)_5O_{12}:Ce^{3+}$, $(Sr,Ca)AlSiN_3:Eu^{2+}$, $(Sr,Ba,Ca,Mg)_2Si_5N_8:Eu^{2+}$, $(Ca,Sr,Ba)_2SiO_4:Eu^{2+}$, $\alpha$-SiAlON:$Eu^{2+}$, $\beta$-SiAlON:$Eu^{2+}$, $(Sr,Ca)S:Eu^2$, $(Sr,Ba,Ca)_2(Si,Al)_5(N,O)_8:Eu^{2+}$, $(Ca,Sr)_8Mg(SiO_4)_4Cl_2:Eu^{2+}$, and $(Sr,Ba)Si_2N_2O_2:Eu^{2+}$.

12. The optoelectronic component according to claim 1, wherein the substrate has a thickness of 50 μm to 200 μm.

13. The optoelectronic component according to claim 1, wherein the adhesive layer has a thickness of 500 nm to 15 μm.

14. A method of manufacturing an optoelectronic component comprising:
A) providing a semiconductor layer sequence having an active region that, during operation, emits radiation at least via a main radiation exit surface,
B) applying a conversion element at least to the main radiation exit surface, said conversion element is self-supporting and is manufactured according to at least B1-B5 before application:
B1) mixing at least one conversion material and a glass powder which, after a subsequent glazing step, produces a glass matrix, and optionally further substances such as solvents and binders to produce a paste,
B2) applying the paste or dispersion to a substrate to form a first layer,
B3) drying the first layer at at least 75° C.,
B4) heating the substrate and the first layer to a temperature at least as high as the temperature at which the glass matrix of the first layer has a viscosity of $10^5$ dPa*s, wherein the temperature is greater than 350° C., and
B5) treating a surface of the first layer facing away from the substrate, wherein the surface of the first layer facing away from the substrate is smoothed.

15. The method according to claim 14, wherein step B2) is carried out by doctoring, screen printing, stencil printing, film casting, dispensing, spin coating or spray coating.

16. An optoelectronic component comprising:
a semiconductor layer sequence having an active region that emits radiation during operation at least via a main radiation exit surface, and
a self-supporting conversion element arranged in a beam path of the semiconductor layer sequence,
wherein the self-supporting conversion element comprises a substrate and a first layer,
the first layer comprises at least one conversion material embedded in a glass matrix,
the glass matrix has a proportion of 50 to 80 vol. % in the first layer,
the substrate is free of the glass matrix and the conversion material and mechanically stabilizes the first layer,
the first layer has a layer thickness of less than 200 μm, and
the at least one conversion material is selected from the group consisting of $(Y,Gd,Tb,Lu)_3(Al,Ga)_5O_{12}:Ce^{3+}$, $(Sr,Ca)AlSiN_3:Eu^{2+}$, $(Sr,Ba,Ca,Mg)_2Si_5N_8:Eu^{2+}$, $(Ca,Sr,Ba)_2SiO_4:Eu^{2+}$, $\alpha$-SiAlON:$Eu^{2+}$, $\beta$-SiAlON:$Eu^{2+}$, $(Sr,Ca)S:Eu^{2+}$, $(Sr,Ba,Ca)_2(Si,Al)_5(N,O)_8:Eu^{2+}$, $(Ca,Sr)_8Mg(SiO_4)_4Cl_2:Eu^{2+}$, and $(Sr,Ba)Si_2N_2O_2:Eu^{2+}$.

* * * * *